(12) United States Patent
Neumann

(10) Patent No.: US 10,443,121 B2
(45) Date of Patent: Oct. 15, 2019

(54) SUSTAINED SELF-SPUTTERING OF LITHIUM FOR LITHIUM PHYSICAL VAPOR DEPOSITION

(71) Applicant: VIEW, INC., Milpitas, CA (US)

(72) Inventor: Martin John Neumann, Pekin, IL (US)

(73) Assignee: View, Inc., Milpitas, CA (US)

( * ) Notice: Subject to any disclaimer, the term of this patent is extended or adjusted under 35 U.S.C. 154(b) by 0 days.

(21) Appl. No.: 14/784,276

(22) PCT Filed: Apr. 24, 2014

(86) PCT No.: PCT/US2014/035358
§ 371 (c)(1),
(2) Date: Oct. 13, 2015

(87) PCT Pub. No.: WO2014/176457
PCT Pub. Date: Oct. 30, 2014

(65) Prior Publication Data
US 2016/0076139 A1    Mar. 17, 2016

Related U.S. Application Data

(60) Provisional application No. 61/815,532, filed on Apr. 24, 2013.

(51) Int. Cl.
*C23C 14/34* (2006.01)
*C23C 14/54* (2006.01)
(Continued)

(52) U.S. Cl.
CPC ........ *C23C 14/3457* (2013.01); *C23C 14/185* (2013.01); *C23C 14/3492* (2013.01);
(Continued)

(58) Field of Classification Search
CPC .............. C23C 14/3457; C23C 14/185; C23C 14/2492; H01J 37/32733; H01J 37/3426; H01J 37/3476
See application file for complete search history.

(56) References Cited

U.S. PATENT DOCUMENTS 3,528,902 A * 9/1970 Wasa Kiyotaka ...... C23C 14/35
204/192.12
4,414,176 A    11/1983 Krauss et al.
(Continued)

FOREIGN PATENT DOCUMENTS

WO    WO 2012/138498 A1    10/2012
WO    WO 2014/176457 A1    10/2014

OTHER PUBLICATIONS

International Search Report and Written Opinion dated Sep. 2, 2014 for Application No. PCT/US2014/035358.
(Continued)

*Primary Examiner* — John J Brayton
(74) *Attorney, Agent, or Firm* — Weaver Austin Villeneuve & Sampson LLP; Brian D. Griedel

(57) ABSTRACT

A method of sustained self-sputtering of lithium in a sputtering station having a lithium metal target, the method comprising initiating a lithium sputtering reaction in the sputtering station by igniting an initial plasma comprising a majority fraction of inert gas ions and inducing a sustained lithium self-sputtering reaction by reducing supply of an inert gas to the sputtering station under conditions that provide a sustained self-sputtering lithium plasma comprising a majority fraction of lithium ions.

25 Claims, 11 Drawing Sheets

(51) Int. Cl.
*H01J 37/32* (2006.01)
*H01J 37/34* (2006.01)
*C23C 14/18* (2006.01)

(52) U.S. Cl.
CPC ........ *C23C 14/54* (2013.01); *H01J 37/32733* (2013.01); *H01J 37/3426* (2013.01); *H01J 37/3476* (2013.01); *H01J 2237/036* (2013.01); *H01J 2237/202* (2013.01); *H01J 2237/2487* (2013.01); *H01J 2237/327* (2013.01); *H01J 2237/332* (2013.01)

(56) References Cited

U.S. PATENT DOCUMENTS

| | | | | |
|---|---|---|---|---|
| 5,830,336 | A | * | 11/1998 | Schulz .................. C23C 14/185 204/192.15 |
| 5,976,334 | A | * | 11/1999 | Fu ........................... C23C 14/32 118/723 MA |
| 6,039,850 | A | | 3/2000 | Schulz |
| 6,736,943 | B1 | * | 5/2004 | Scobey .................. C23C 14/34 204/192.12 |
| 2008/0099326 | A1 | | 5/2008 | Ye et al. |
| 2010/0264016 | A1 | | 10/2010 | Anders et al. |
| 2012/0152727 | A1 | | 6/2012 | Kwak et al. |

OTHER PUBLICATIONS

Neumann, M., "Lithium sputtering, deposition and evaporation controlled thin film engineering," VDM Verlag Dr. Muller, ISBN: 978-3-639-04189-7, 2008, 178 pages.

Posadowski, WM, Sustained self sputtering of different materials using dc magnetron, Pergamon, vol. 46, Nos. 8-10, 0042-207X(95)00096-8, Elsevier Science Ltd., 1995, 4 pages.

Posadowski, WM et al., "Sustained selfsputtering using a direct current magnetron source," J. Vac. Sci. Technol. A., vol. 11, No. 6, Nov./Dec. 1993, 6 pages.

International Preliminary Report on Patentability dated Nov. 5, 2015 for Application No. PCT/US2014/035358.

Sigmund, Peter, "Theory of Sputtering. I. Sputtering Yield of Amorphous and Polycrystalline Targets," Phs. Review, vol. 184, No. 2, Aug. 10, 1969, pp. 383-416.

* cited by examiner

| Table | | | |
|---|---|---|---|
| Pressure (mT) | Pressure (Torr) | MFP (cm) | MFP (in) |
| 100 | 1.00E-01 | 0.05 | 0.019685 |
| 90 | 9.00E-02 | 0.055555556 | 0.021872 |
| 80 | 8.00E-02 | 0.0625 | 0.024606 |
| 70 | 7.00E-02 | 0.071428571 | 0.028121 |
| 60 | 6.00E-02 | 0.083333333 | 0.032808 |
| 50 | 5.00E-02 | 0.1 | 0.03937 |
| 40 | 4.00E-02 | 0.125 | 0.049213 |
| 30 | 3.00E-02 | 0.166666667 | 0.065617 |
| 20 | 2.00E-02 | 0.25 | 0.098425 |
| 15 | 1.50E-02 | 0.333333333 | 0.131234 |
| 10 | 1.00E-02 | 0.5 | 0.19685 |
| 9 | 9.00E-03 | 0.555555556 | 0.218723 |
| 8 | 8.00E-03 | 0.625 | 0.246063 |
| 7 | 7.00E-03 | 0.714285714 | 0.281215 |
| 6 | 6.00E-03 | 0.833333333 | 0.328084 |
| 5 | 5.00E-03 | 1 | 0.393701 |
| 4 | 4.00E-03 | 1.25 | 0.492126 |
| 3 | 3.00E-03 | 1.666666667 | 0.656168 |
| 2 | 2.00E-03 | 2.5 | 0.984252 |
| 1 | 1.00E-03 | 5 | 1.968504 |
| 0.9 | 9.00E-04 | 5.555555556 | 2.187227 |
| 0.8 | 8.00E-04 | 6.25 | 2.46063 |
| 0.7 | 7.00E-04 | 7.142857143 | 2.812148 |
| 0.6 | 6.00E-04 | 8.333333333 | 3.28084 |
| 0.5 | 5.00E-04 | 10 | 3.937008 |
| 0.4 | 4.00E-04 | 12.5 | 4.92126 |
| 0.3 | 3.00E-04 | 16.66666667 | 6.56168 |
| 0.2 | 2.00E-04 | 25 | 9.84252 |

*FIG. 2A*

SUSTAINED SELF-SPUTTERING OF LITHIUM FOR LITHIUM PHYSICAL VAPOR DEPOSITION

CROSS-REFERENCE TO RELATED APPLICATIONS

This application is a national stage application under 35 U.S.C. § 371 to International Application PCT/US14/35358, filed on Apr. 24, 2014 and titled "SUSTAINED SELF-SPUTTERING OF LITHIUM FOR LITHIUM PHYSICAL VAPOR DEPOSITION," which claims the benefit of and priority under 35 U.S.C. § 119(e) to U.S. Provisional Patent Application Ser. No. 61/815,532, filed on Apr. 24, 2013 and titled "SUSTAINED SELF-SPUTTERING OF LITHIUM FOR LITHIUM PHYSICAL VAPOR DEPOSITION," both of which are hereby incorporated by reference in their entirety and for all purposes.

FIELD

Embodiments disclosed herein generally relate to sputtering methods and more particularly to systems, apparatus, and methods for sustained self-sputtering of lithium.

BACKGROUND

Sputtering refers to the transfer of energy and momentum from an impinging energetic particle to a target material. If the energy transfer is high enough to overcome the binding energy of the atoms in the target, the target atom or atom will be ejected. The ejected target atoms are then free to be transported to a workpiece. Sputtering is typically used for thin-film deposition in high-tech applications such as in fabrication of semiconductor wafers, solar cells, and electrochromic windows. For example, sputtering may be used to deposit or otherwise incorporate target material in a stack of material layers on a glass or otherwise transparent substrate to form electrochromic devices used to make electrochromic windows. Many of these high-tech applications required highly uniform deposition in order to make their devices perform well. In addition, as technology advances, coatings in some devices become thinner and thinner, and thus uniformity of the layers making up such coatings must be commensurately higher. Some electrochromic devices are fabricated by a process that includes deposition of lithium on a partially fabricated device. Frequently, the deposition is by sputtering.

In conventional sputtering processes, argon plasma or other inert gas plasma is used to sputter material from the target. Conventional physical vapor deposition sputtering typically has a noble gas dominated environment during sputtering of the target atoms. In this environment, interactions with the target can be more prevalent by noble gas ions than with the target ions. For some target materials such as lithium, this may lead to various problems such as poor deposition rates and/or non-uniformity of the deposited material.

SUMMARY

Embodiments disclosed herein include systems, apparatus, and methods for implementing sustained self-sputtering of lithium. In certain cases, an initial plasma is ignited while noble gas is supplied to the sputtering station. In this initial plasma, sputtering gas ions are a majority fraction of the sputtering species responsible for dislodging lithium atoms from a lithium metal target. Once sputtering is underway, the supply of sputtering gas is slowly and significantly reduced under certain conditions that convert the initial sputtering reaction to a sustained self-sputtering reaction. As the supply of sputtering gas is reduced, sputtering gas ions responsible for dislodging lithium atoms are substantially replaced with self-sputtering lithium ions in the region near the lithium metal target to generate sustained self-sputtering lithium plasma. Lithium atoms ejected from the lithium metal target may incorporate into a workpiece located in the sputtering station. In one example, the workpiece may include a partially fabricated electrochromic device of a stack of materials on a substantially transparent substrate (e.g., glass). In this example, lithium atoms may be incorporated into at least one of the surface layers of the partially-fabricated electrochromic device. In one aspect, operating conditions may be adjusted to maintain the sustained self-sputtering plasma and/or adjust the flux of lithium toward the workpiece.

One aspect is a method of sustained self-sputtering of lithium in a sputtering station having a lithium metal target. The method includes initiating a lithium sputtering reaction in the sputtering station by igniting an initial plasma comprising a majority fraction of inert gas ions. The method also includes inducing a sustained lithium self-sputtering reaction by reducing supply of an inert gas to the sputtering station under conditions that provide sustained self-sputtering lithium plasma comprising a majority fraction of lithium ions. The workpiece may comprise a partially fabricated electrochromic device, wherein the lithium is incorporated into one or more layers of the partially fabricated electrochromic device. In some cases, the method also includes incorporating lithium from the lithium metal target into a workpiece while the workpiece is in the sputtering station.

Another aspect is sustained lithium self-sputtering apparatus comprising a sputtering station and a controller. The sputtering station comprises a chamber, an anode, and a lithium metal target functioning as a cathode. In some cases, portion of the chamber functions as the anode. The sputtering station also includes a voltage source electrically connected to the anode and the cathode. The sputtering station also includes an inlet for regulating flow of an inert gas into the chamber. The controller is configured to provide conditions in the sputter station to induce and maintain a sustained self-sputtering lithium plasma. The controller is configured to communicate signals to the voltage source to coordinate delivery of a potential between the anode and the cathode and to communicate signals to the inlet to regulate the flow of the inert gas.

These and other features and embodiments will be described in more detail below with reference to the drawings.

BRIEF DESCRIPTION OF THE DRAWINGS

FIG. 2A is a table showing examples of values of background pressure that correspond to different mean free paths, according to embodiments.

DETAILED DESCRIPTION

Figure 1:
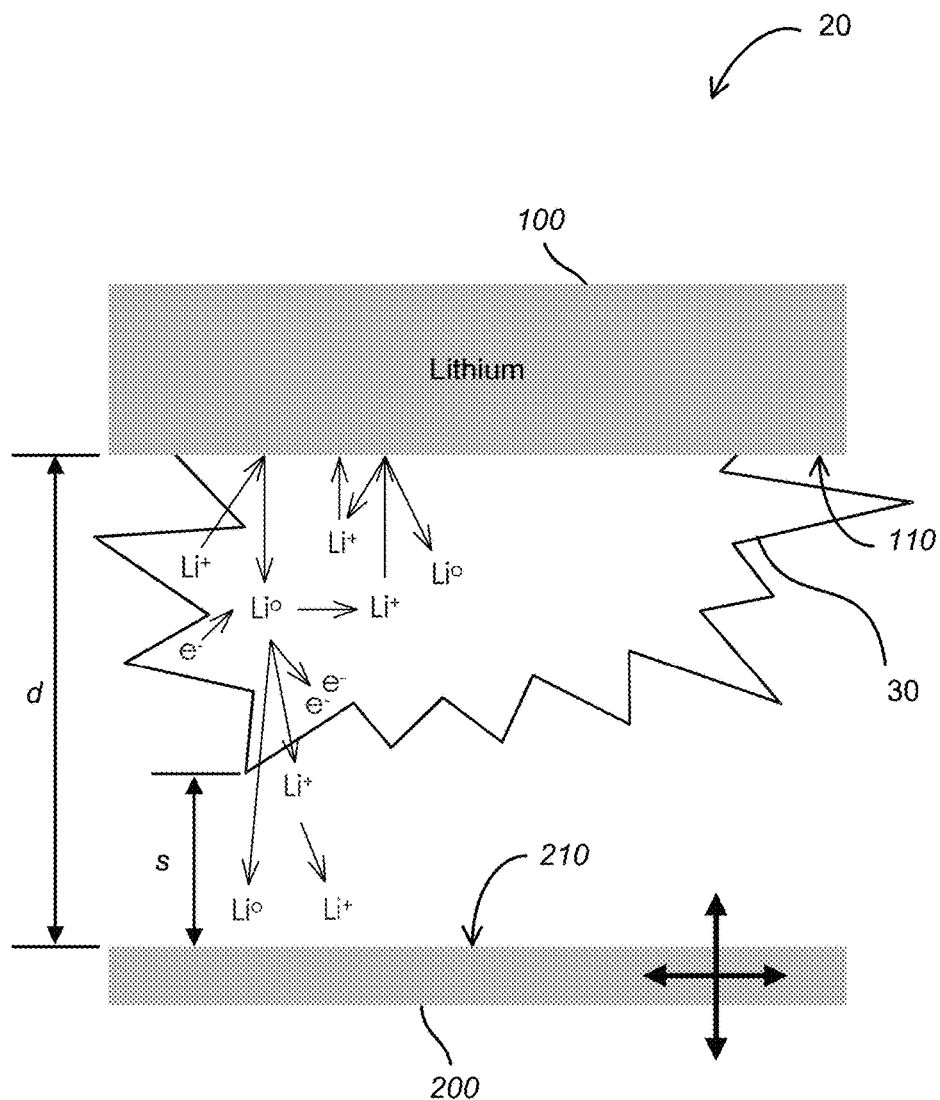
FIG. 1 is a schematic drawing of a sustained lithium self-sputtering apparatus, according to embodiments.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

I. Self-Sputtering

When an energetic ion impinges the surface of a target material, the resulting energy transfer can result in ejection of a target atom. This is governed by the mass of the incident ion, the energy of the incident ion, the angle at which it strikes, the energy of the target atom, the mass of the target atom, and the structure of the target. There is conservation of momentum and energy in this process. During the process, some target atoms may be ejected as neutral and others in ion form. Target atoms ejected as neutral atoms can travel through the plasma, interact with electrons, and become ionized in the same way as neutral gas atoms passing through the plasma. This degree of ionization of the neutral target atoms is dictated by the binding energy of the outermost electron in the neutral species. Once an ion forms, the target atoms are subject to the same electric field interactions as the gas ions. This means the ejected target atoms can be attracted back to the target by the cathode's negative electric field and either redeposit on the target surface or they can act to sputter the target. Sputtering of the target with ions of itself that have either been ejected in ion form or ejected in neutral form and then ionized in the plasma and attracted back to the target surface is referred to as self-sputtering. Self-sputtering has its own unique sputter yield curve and can generate secondary electrons. These secondary electrons can help support the plasma. The more concentrated the electrons are near the target, the higher the likelihood that self-sputtering will occur.

Generally, lithium is difficult to sputter in its pure or substantially pure form. Lithium is difficult to purify, highly volatile and reactive, easily contaminated, hard to control, and easily melts. This can make procurement difficult and forming the material into a target shape challenging. In addition, handling lithium in this form requires a very clean environment to prevent contamination. In some instances, lithium is considered a controlled material, which introduces additional obstacles to handing. Most thin-film devices do not have a need for sputtering lithium.

Lithium is light weight and easily ionized. As such, a high fraction of lithium ejected from a lithium metal target is usually ionic rather than being neutral atoms. Previous modeling of conventional lithium sputtering techniques had shown that the fraction of lithium sputtered in ion form was immediately attracted back to the lithium metal target due to the plasma sheath potential drop. An example of such modeling results can found in Neumann, Martin J., *Lithium Sputtering, Deposition and Evaporation*, 2007, which is hereby incorporated by reference in its entirety for all purposes. In this example, the energy distribution of lithium sputtered ions peaked at 1-2 eV and almost all of the emitted sputtered Li+ ions were re-deposited at or near their origination point at the lithium metal target with energy equal to their emitted energy and emitted angle and hence, did not contribute to the ejection (sputtering) of other target atoms.

II. Sustained Self-Sputtering of Lithium

With certain metal target materials under unique operating conditions, the metal target atoms are ionized to an ion density that is high enough that the metal ions can drive continued plasma by providing a vehicle for a continued electron cascade rather than the neutral sputtering gas. If the number of metal ions striking the metal target surface is the same as or more than the number ejected, few or no additional energetic ions, such as from the sputtering gas, are needed to sustain the plasma. At this point, the sputtering gas can be substantially reduced or removed, and the discharge will continue sustained the plasma. "Sustained self-sputtering" or "pure self-sputtering" refers to the induced state of a sputtering process at which point the sputtering gas species is responsible for less than a majority of the sputtering. For example, the ionized metal species are responsible for the majority (e.g., over 50%, 90%, 99%, etc.) of the sputtering off the metal target. In a sustained self-sputtering reaction, the plasma is self-sustaining without requiring much if any sputtering gas. To the extent that sputtering gas is present in a sustained self-sputtering reaction, it is provided at a level far below that required for conventional sputtering (non-self-sputtering). When achieving sustained self-sputtering, the supply of sputtering gas can be substantially reduced or removed without extinguishing the self-sustaining plasma.

Embodiments disclosed herein include systems, apparatus, and methods that use unique techniques for sustained self-sputtering of lithium. FIG. 1 is a schematic drawing of sustained self-sputtering of lithium in a sustained lithium self-sputtering apparatus 20, according to embodiments. The apparatus 20 may be employed as part of a lithium sputtering station (e.g., lithium deposition station). The lithium sputtering station may be a station in a sustained lithium self-sputtering system having one or more stations.

In FIG. 1, the sustained lithium self-sputtering apparatus 20 includes a lithium metal target 100 and a workpiece 200 that receives ejected lithium atoms from the lithium metal target 100. A lithium metal target as described herein (e.g., lithium metal target 100) may be comprised of at least 75% lithium metal, at least 85% lithium metal, at least 90% lithium metal, or at least 99% lithium metal. For example, lithium metal may be alloyed with other metals to improve workability, strength, or other physical properties. Certain lithium metal targets are commercially available in high purity, e.g. >99% lithium metal. The lithium metal target 100 has a surface 110 and the workpiece 200 has a surface 210 facing the surface 110 of the lithium metal target 100. The surface 110 of the lithium metal target 100 is separated by a distance d from the surface 210 of the workpiece 200. In FIG. 1, the lithium metal target 100 functions as a cathode and another component of the lithium sputtering station acts as the anode. For example, the lithium sputtering station may comprise a chamber with an inner wall or other component (e.g., a substrate holder) that may function as an anode. In other embodiments, different components may function as an anode and/or cathode.

In FIG. 1, a sustained lithium self-sputtering reaction is taking place in the apparatus 20 and a self-sustaining lithium plasma 30 exists between the surface 110 of the lithium metal target 100 and the surface 210 of the workpiece 200. A self-sustaining lithium plasma generally includes $Li^+$ (lithium ions) as a majority fraction (i.e. fraction between 50% and 100%) of the sputtering species. In this self-sustaining lithium plasma, the sputtering gas atoms are the minority fraction of the sputtering species (i.e. fraction between 0% and 50%). In FIG. 1, the self-sustaining lithium plasma 30 includes $Li^+$ (lithium ions) as a 100% fraction of the sputtering species and the sputtering gas atoms (0% fraction) are not participating. In other embodiments, the sputtering gas atoms may be a larger fraction (e.g., 1%, 2%, 5%, 10%, 15%, or other fraction less than 50%) of the sputtering species in the self-sustaining lithium plasma 30.

The closest distance between the self-sustaining sputtering plasma 30 and the surface 210 of the workpiece 200 is depicted as a distance s in FIG. 1. The distance d and distance s may be adjusted by moving the workpiece 200 toward or away from the surface 110 of the lithium metal target 100 as depicted by the vertical double arrow. The distance s may be adjusted to control the interaction of the plasma with the surface 210 of the workpiece 200. For example, the distance d may be adjusted to control the distance s to maintain a value above a minimum value (e.g., 1 mm, 2 mm, 5 mm, 10 mm, 20 mm, 30 mm, 40 mm, etc.) to prevent the self-sustaining sputtering plasma 30 from directly interacting with the workpiece 200. In another example, the distance d may be adjusted to maintain an average distance between different outer points of the self-sustaining sputtering plasma 30 and the surface 210 of the workpiece 200 above a minimum value (e.g., 1 mm, 2 mm, 5 mm, 10 mm, 20 mm, 30 mm, 40 mm, etc.).

In certain aspects, a self-sustaining sputtering plasma may be designed to have a certain size and/or geometric shape (e.g., oval), which may be driven by the sputtering application. The size and shape of the plasma can be controlled by adjusting various parameters such as the power applied between the anode and cathode, the shape and size of the anode and/or cathode, and the temperature and pressure in the reaction station. Various publically-available software programs can be used to model plasma parameters to aid in the design of the shape and size of plasma.

FIG. 1 illustrates examples of interactions that may exist between the lithium metal target 100 and the workpiece 200 during a sustained lithium self-sputtering reaction in the apparatus 20. For example, $Li^+$ (lithium ions) impinging the target surface 110 can sputter $Li^0$ (neutral lithium atoms) or $Li^+$. In this illustration, many of the ejected $Li^+$ are immediately accelerated back to the target surface 110 and can sputter additional lithium atoms depending on the sputter yield at the existing operating conditions. The $Li^0$ travelling through the self-sustaining lithium plasma 30 can be ionized to form $Li^+$. Some $Li^0$ and $Li^+$ can travel to the surface 210 for incorporation into the workpiece 200.

The workpiece 200 may include a substrate such as, for example, a substantially transparent substrate (e.g., glass). In certain aspects, the workpiece 200 may include a partially or completely fabricated electrochromic device having one or more material layers on a substantially transparent substrate. One of these one or more material layers may be a layer having an anodically coloring electrochromic material such as a material comprising nickel, tungsten, and oxygen. Another material may be a cathodically coloring electrochromic material such as tungsten oxide.

During the sustained lithium self-sputtering process, the workpiece 200 is located in the lithium sputtering station (e.g., sputtering chamber) of the sustained lithium self-sputtering system. The workpiece 200 may be passed (e.g. translated linearly as depicted by the horizontal arrow in FIG. 1 and/or or rotationally) through the lithium sputtering station during the sustained self-sputtering process to incorporate ejected lithium atoms (e.g., lithium ions) into the workpiece 200. In some cases, the distance between the workpiece 200 and the cathode (e.g., distance d in FIG. 1) is controlled during the process. For example, the workpiece 200 may be moved to maintain the distance between workpiece 200 and cathode above a predefined minimum distance that could prevent, for example, direct interaction between the self-sustaining sputtering plasma and the workpiece 200. In embodiments with a workpiece 200 having a partially or completely fabricated electrochromic device, lithium atoms are incorporated into one or more surface layers of the electrochromic device during the sustained lithium self-sputtering process.

To induce a sustained lithium self-sputtering state requires, as mentioned, a unique set of operating and design conditions. The electric and magnetic field design of the lithium metal target, power/current density in addition to the material properties of the lithium metal target generally govern whether a sustained state may be induced. The material properties of the lithium metal target also govern the self-sputtering yield, which must be maintained high enough to support sustained self-sputtering at a given energy level. In certain cases, high power-pulsed DC systems can be used to induce a sustained self-sputtering reaction by increasing the ionization fraction of metal ions in the plasma. Under these and other unique operating and design conditions, the flow of sputtering gas can be greatly reduced or eliminated as it is no longer needed to sustain the plasma. Stated another way, the pressure of the sputtering gas can be reduced to a low level or completely shut off leaving only a trace level of sputtering gas.

Some characteristics of sustained self-sputtering lithium plasma are associated with plasma density, the ratio of lithium ions to neutrals, and the ratio of lithium species to sputtering gas species. Another characteristic of a sustained lithium self-sputtering reaction is associated with the mean-free path between lithium ions in the self-sustaining plasma. A mean free path, $\lambda_m$, can refer to the average distance that a particle will travel before making a collision with another particle and can be defined by Eqn. 1 below. In certain embodiments, the mean free path is maintained below a required maximum level to maintain a sustained self-sputtering lithium plasma. From one perspective, if there are too few ejected lithium species or sputtering gas molecules present, the electrons have a lower probability of interacting to create more electrons and ions, which drives the self-sustaining plasma. The electrons lose some energy with each collision. If there are too many sputtering gas molecules, the electrons lose energy because of too many collisions and they do not have enough time to regain the energy so that they cannot ionize the neutral gas molecules and they cannot complete the circuit. The more sputtering gas molecules present, the smaller the mean free path. The fewer sputtering gas molecules, the larger the mean free path. In one example, a self-sustaining lithium plasma condition is characterized by whether a mean-free path value is below a required maximum level.

Figure 2B:
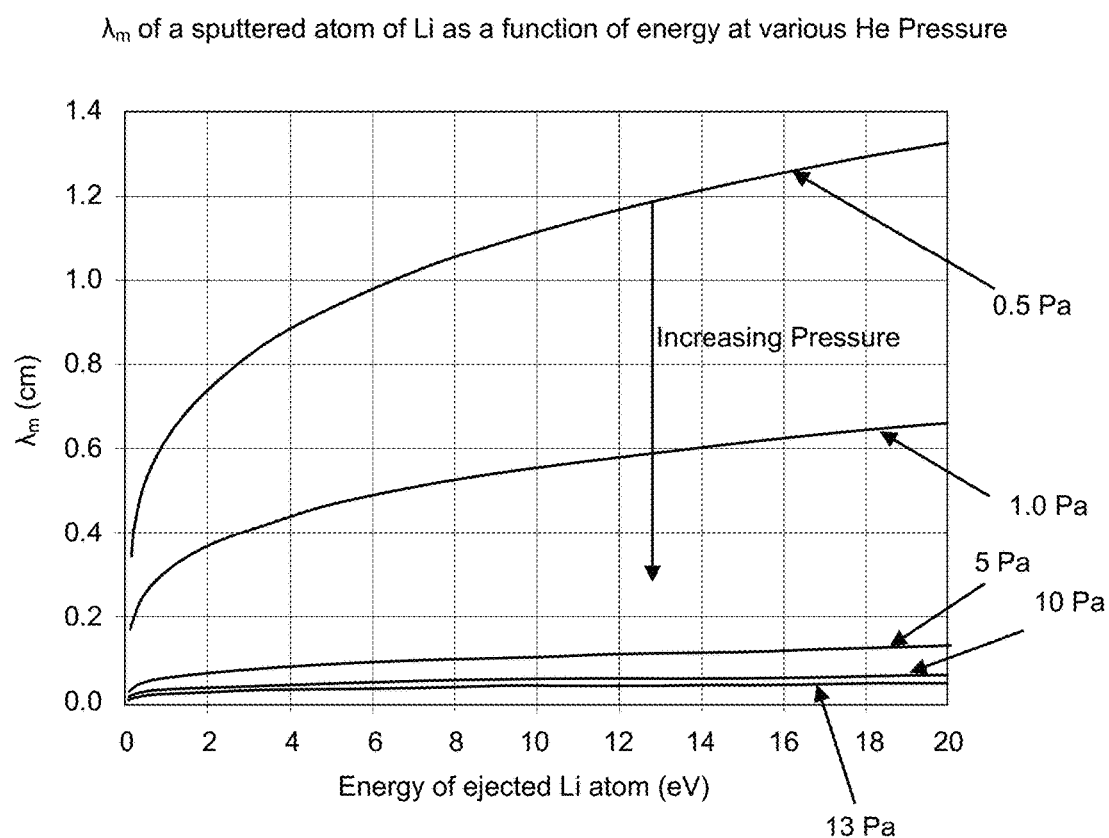
FIG. 2B is a graph of mean free path of lithium in a helium plasma versus the energy of the ejected Li atom, according to embodiments.

Of course, the required mean-free path for sustained self-sputtering of lithium will be a function of the background chamber pressure, the potential difference between anode and cathode, the distance to other potential interaction sources (e.g. walls) that can cause a charge loss, etc. Eqns. 1-3 provided below describe the relationship between mean free path and various operational parameters. In certain cases, the background chamber pressure is at or below 1 mT for a sustained lithium sputtering plasma condition. In some cases, the absolute pressure range is 0.0001 Torr (0.1 mTorr) to 0.001 Torr (1 mTorr) for self-sputtering of lithium. Once the mean free path increases beyond a certain value, then there is a significant loss of ions to wall surfaces of the sputtering chamber. This value depends on chamber/system geometry, background pressure, and secondary electron emission of the sputtering target surface. FIG. 2A is a table showing examples of values of background pressure that correspond to different mean free path (MFP) values. FIG. 2B is a graph of mean free path of lithium in a helium plasma versus the energy of the ejected Li atom.

$$\lambda_m = \frac{0.01 A (1.5 k_B E_{Sput})^{\frac{1}{4}}}{6} \frac{T^{\frac{5}{4}}}{P} \quad \text{(Eqn. 1)}$$

Where: $\lambda_m$: Mean free path [cm]
$k_B$: Boltzmann's constant [eV/K]
$E_{Sput}$: Average kinetic energy of ejected atom from target [eV]
T: Gas temperature [K]
P: Gas pressure [Pa]
A: Energy independent coefficient [Pa cm/K eV½]

$$A = \frac{0.012}{M_g^{1/2}} \left(1 + \frac{1}{\mu}\right)^{\frac{1}{2}} \left(1 + \mu^{\frac{2}{3}}\right)^{\frac{3}{4}} \quad \text{(Eqn. 2)}$$

Where:
$M_g$: Mass of background gas [amu]
μ: Ratio of atomic mass of background gas to sputtered target material $$\mu = \frac{M_g}{M_t} \quad \text{(Eqn. 3)}$$

Where: $M_t$: Mass of sputtered atom [amu]

As discussed above, a sustained lithium self-sputtering reaction can be induced when a unique set of one or more operating and/or design conditions is applied. The plasma should be self-sustaining under these applied conditions, which include power applied to the system, pressure (which corresponds to mean free path), etc. As indicated above, the supply of sputtering gas (e.g., inert gas) is at or below a certain minimum level (i.e. trace level) without extinguishing the plasma. In certain embodiments, the supply of the sputtering gas may be based on the flow rate or pressure at the inlet of the sputtering gas to the sputter chamber at the lithium sputtering station. In one example, a trace level of sputtering gas corresponds to an inlet pressure of 1 mTorr is a condition for a sustained lithium self-sputtering reaction. Another condition may be that the ratio of the ionized lithium sputtering species to ionized sputtering gas sputtering species is at or above a certain percentage (e.g., 50%, 60%, 90%, 99%, etc.). Another condition may be that the absolute pressure in the sputtering chamber is between 0.0001 Torr (0.1 mTorr) and 0.001 Torr (1 mTorr). Another condition is that the mean-free path of lithium ions in the plasma is at or below a certain maximum level. For a sustained lithium sputtering plasma condition, the mean-free path (MFP) in meters is approximately related to the chamber pressure by: MFP (m)=0.061 (mTorr/m)/Pressure (mTorr). That is, for background pressure of 0.1 mTorr, the MFP=0.061/0.1=61 cm. For background pressure of 1 mTorr, the MFP=0.061/1 mTorr=6.1 cm. In certain cases, one condition is that the mean free path is between 6.1 cm and 61 cm.

Figure 3A:
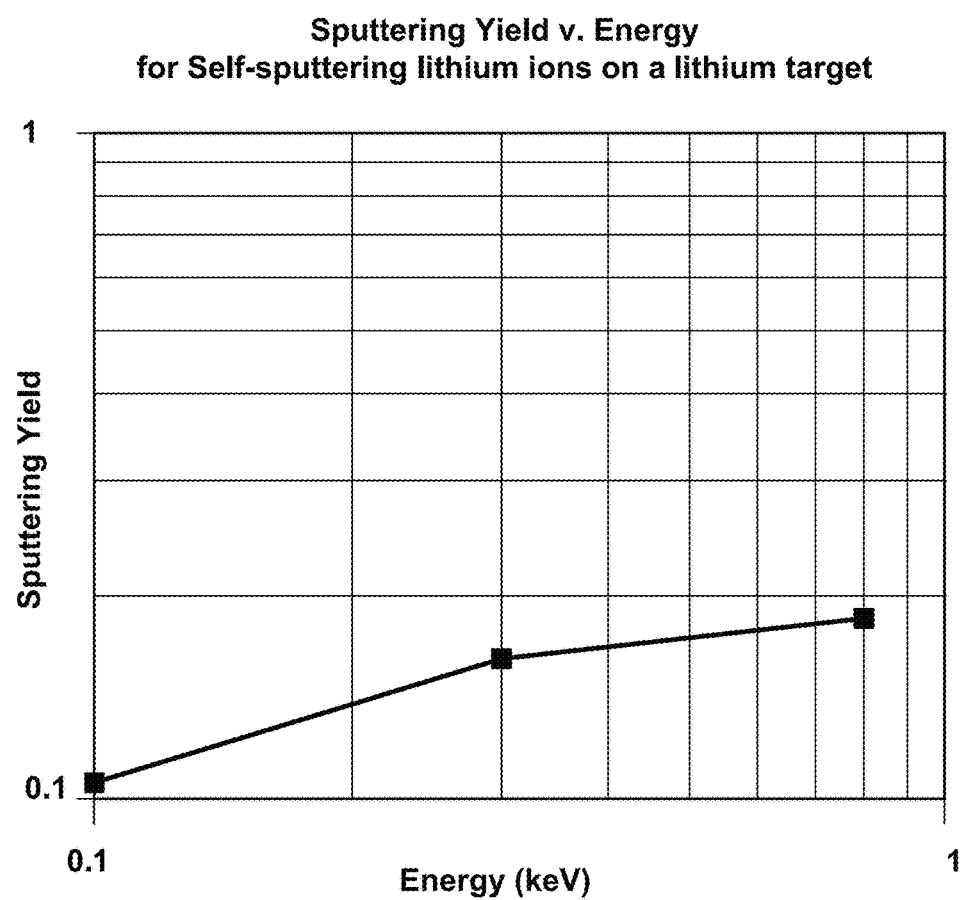
FIG. 3A is a plot of a sputter yield curve for self-sputtering of lithium ions on a lithium metal target, according to an embodiment.

Another condition for inducing a sustained lithium self-sputtering reaction is that the distance between the cathode and anode generally needs to be greater than the distance of the mean free path of electrons at that pressure. That way the plasma can continue. If the anode is less than the mean free path distance, the anode will act as a sink for the electrons, deplete the plasma of electrons, limit ionization events, and eventually extinguish the plasma. FIG. 3C is a schematic illustration of a self-sputtering reaction when the distance between the anode and cathode is greater than the mean free path of the electron. FIG. 3D is a schematic illustration of a self-sputtering reaction when the distance between the anode and cathode is less than the mean free path of the electron. In FIG. 3C, the initial self-sputtering event Li sputter atoms to escape the lithium metal target. The neutral atoms will deposit and the ions will be attracted back to the surface and continue sputtering. In this case, the electron can interact with another neutral atom to form an electron/ion pair. In FIG. 3D, the anode removes the electrons from the system and the plasma will eventually extinguish. In one case, the distance between the cathode and anode is greater 61 cm, which is the mean free path approximately corresponding to a background pressure of 0.1 mTorr. In another case, the distance between the cathode and anode is greater than 100 cm. In yet another case, the distance between the cathode and anode is between 60 and 100 cm.

A. Plasma Sustainability and Sputter Yield

In order for plasma to continue to exist, there needs to be a supply of electrons, either from an external source (e.g. inert gas) or from atoms ejected from the target itself, as is the case in a sustained self-sustaining reaction. Self-sustaining plasma is achieved when on average each electron generates another electron(s) by collision. This generation of "secondary electrons" is a function of energy, pressure, and material being struck. The power supply on a cathode governs both a supply of electrons and the energy at which the ions impinge the cathode surface. This will go towards dictating the number of target atoms ejected from the target surface and associated sputter yield. Sputter yield can refer to the number of atoms of a particular target material that are ejected for every one sputtering atom at a given energy. Sputter yield for self-sputtering can refer to the number of atoms (either neutral or ions) of target material ejected for every impinging ion.

Sputter yield curves show the relationship between sputter yield in atoms/ions for different ion energy levels. For magnetron sputtering, the sputter yield curves are typically generated for normal incidence (0°) because of the magnetic and electric field lines. Normal incidence refers to the condition under which ions strike the target from a direction normal to the surface of a target. FIG. 3A is a plot of a sputter yield curve for self-sputtering of lithium ions on a lithium metal target, Li+→Li. The sputter yield curve in FIG. 3A was determined from a simulation using a public domain code Stopping Ranges of Ions in Matter (SRIM). SRIM is a basic modeling code that is theoretical in nature and correlated to experimental data.

Sustained self-sputtering of lithium can be characterized by the existence of a self-sputter yield of greater than 1.0 for lithium ions striking a lithium metal target (Li+ on Li). Self-sputter yield is a strong function of the angle of incidence of the striking ions to the lithium metal target surface. Although a target surface may appear flat and may be approximated as a flat surface, at a local or molecular level the actual surface of the lithium metal target is not perfectly smooth and is contoured. Thus, while most or all ions may approach the sputter target from a direction normal to the plane approximating the flat surface, at a local or molecular level, the ions may actually be impinging at an angle of incidence to the actual surface. Some of the impinging lithium ions that may be coming in from a normal direction to a plane at the approximated flat surface and strike the actual surface at an angle of incidence that deviates significantly from normal. As a consequence, there is a distribution of angles of incidence to the actual surface during a sustained self-sputter reaction.

Figure 3B:
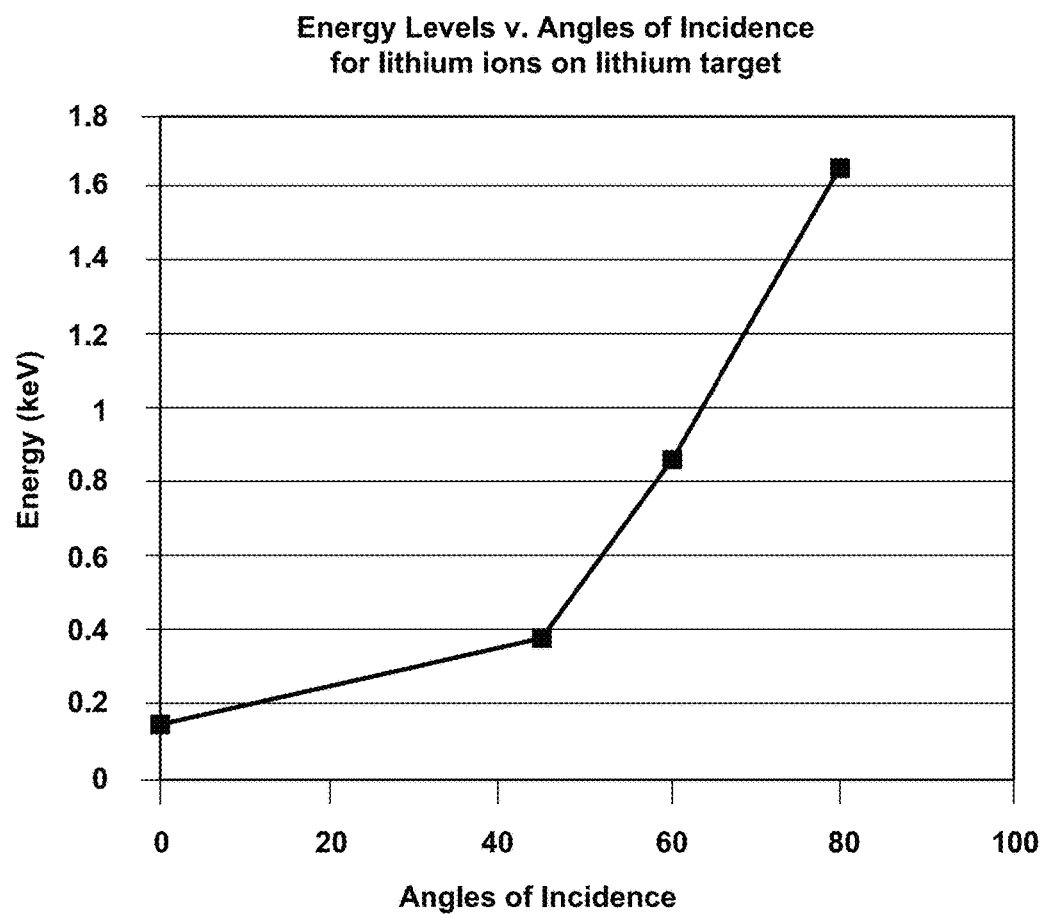
FIG. 3B is a plot showing energy levels at different angles of incidence of lithium ions impinging on the lithium metal target, according to an embodiment.
Figure 3C:
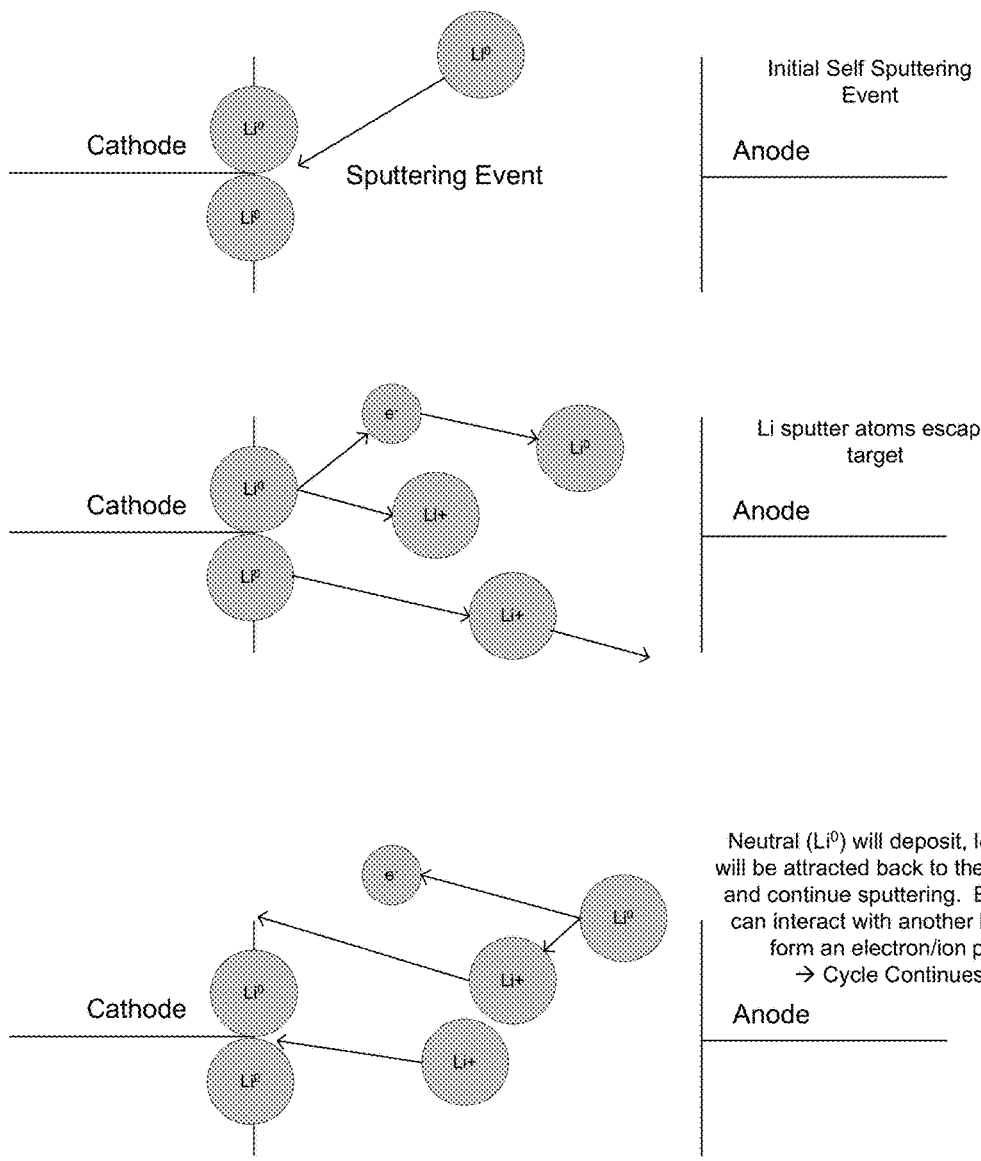
FIG. 3C is a schematic illustration of a self-sputtering process when the distance between the anode and cathode is greater than the mean free path of the electron.
Figure 3D:
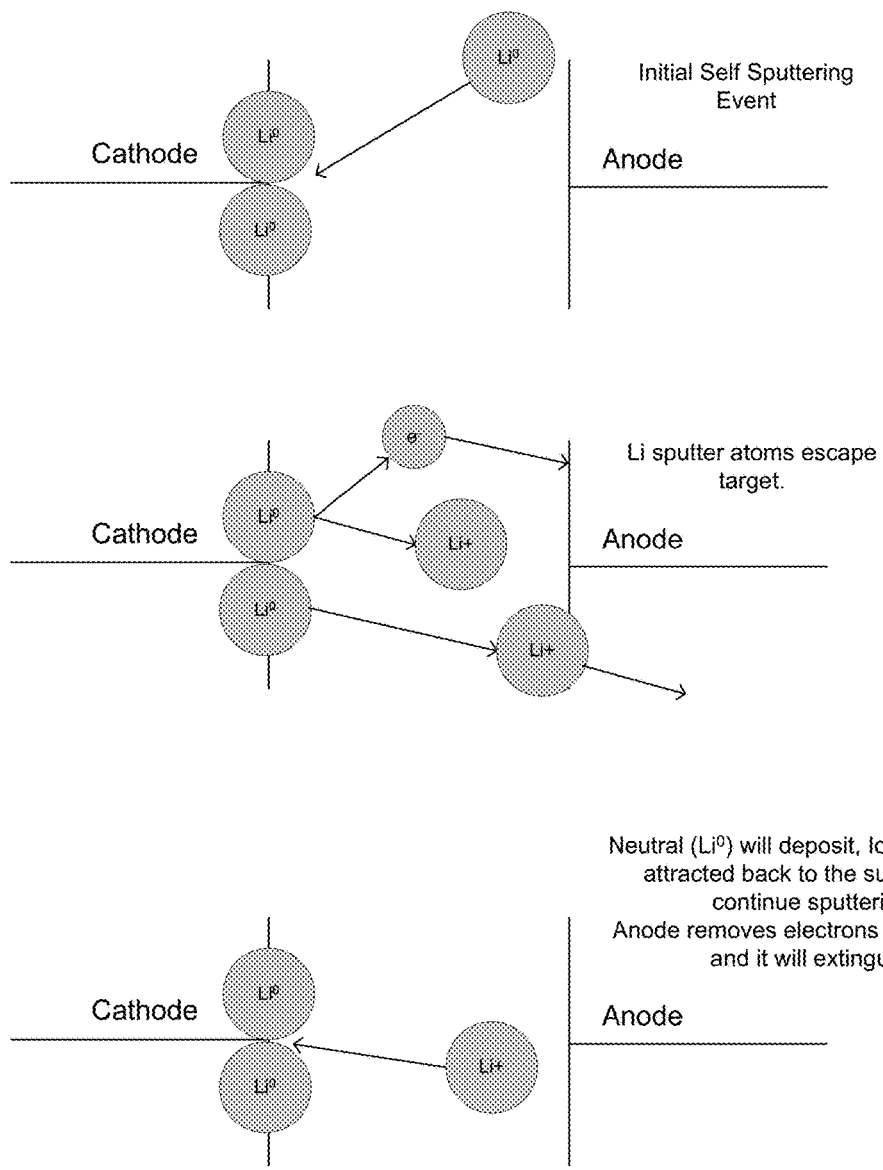
FIG. 3D is a schematic illustration of a self-sputtering process when the distance between the anode and cathode is less than the mean free path of the electron.

FIG. 3B is a plot showing energy levels at different angles of incidence of the lithium ions impinging on a lithium metal target. As shown, the energy level varies significantly depending on the actual angle of incidence to the surface. Because the self-sputter yield is a strong function of the actual angle of incidence, one needs to determine an average or weighted average self-sputter yield for the multiple angles of incidence that lithium ions strike the actual target surface. The weighted average takes into account the distribution of angles of incidence of all lithium ions striking the sputter target, which is based on the surface roughness of the lithium metal target. The energy ranges of the Li+ based on a Maxwellian distribution centered around 200-500 V. A sputter yield curve for lithium Li+→Li based on a distribution of angles of incidence is provided in FIG. 3A.

B. Applications

Embodiments disclosed herein may provide one or more technical advantages. One advantage is that sustained self-sputtering of lithium can limit the region occupied by the plasma to within close proximity of the lithium metal target so that the region does not substantially extend to and interact with the workpiece in its carrier. Another advantage is that sustained self-sputtering can provide better control of lithium flux to the workpiece surface. In fabrication of electrochromic devices, control of lithium flux to the workpiece surface has a significant impact on the quality of the devices. It has been observed that if lithium flux increases beyond a particular level, electrochromic device performance may be unacceptable. It is believed that if metallic lithium forms on the workpiece surface for longer than a particular threshold "residence time," negative results may be observed. Problems may occur because metallic lithium is a very strong getter material. That is, it will absorb many gasses or other materials it comes into contact with including hydrogen, oxygen, and water. The incorporation of these materials into an electrochromic device may degrade it. Further, the presence of metallic lithium on the surface of the electrochromic device may alter the morphology of the underlying active layers and thereby diminish performance. Therefore, it is desirable that the flux of lithium to the surface of the workpiece be controllable so that it does not exceed the level at which metallic lithium resides on the workpiece surface for length of time greater than the threshold residence time.

By using the sustained self-sputtering of lithium techniques of disclosed embodiments, lithium flux can be controlled so that the metallic lithium does not reside on the workpiece surface for an inappropriately long time. It is believed that a fraction of the sputtered lithium coming into contact with the workpiece surface is in the form of zero valence lithium (i.e. metallic lithium) and some fraction is ionized lithium having a charge of +1. The ionized lithium may incorporate directly into the device without substantially degrading performance of the electrochromic device. The neutral lithium more likely deposits as elemental lithium on the surface which is then converted to lithium cations which diffuse into the electrochromic device. Thus, the neutral lithium may more likely be a source of problems in electrochromic devices.

In conventional sputtering (non-self sputtering) of lithium metal targets, the plasma has been found to sometimes extend to a position beyond the target where it can directly interact with the workpiece. Using sustained self-sputtering techniques of disclosed embodiments may allow control of the lithium plasma to be localized near the surface of the lithium metal target and not extend to the workpiece or otherwise substantially interact with the workpiece. When a plasma directly contacts or otherwise interacts with the workpiece, it may produce localized differential electric fields on the surface of the workpiece. These differential fields may result in differential rates of lithium incorporation over the face of the workpiece surface. This may result in non-uniform incorporation of lithium over the face of the workpiece surface which may lead to failure in an electrochromic device or at a minimum, non-uniform optical properties over the face of an electrochromic device. The sustained self-sputtering processes of embodiments resemble evaporation or vapor deposition processes, which are relatively controllable or at least less likely to produce differential electric field strengths on the workpiece surface than conventional sputtering processes.

Figure 4A:
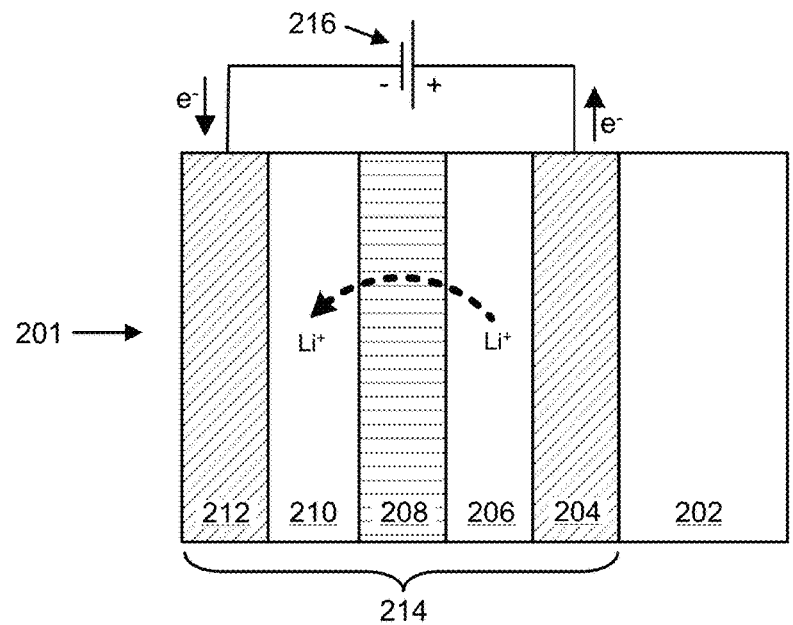
FIGS. 4A and 4B depict the structure of electrochromic devices, according to embodiments.
Figure 4B:
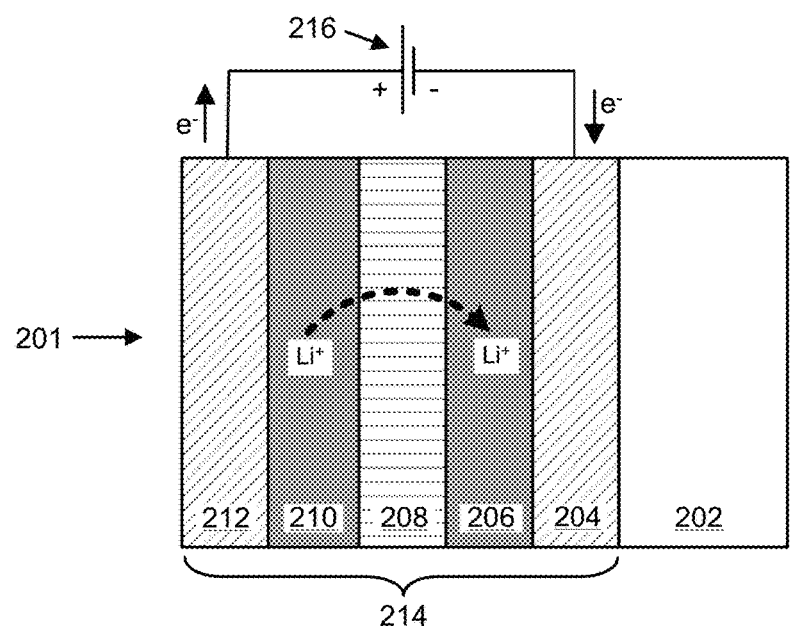

In certain embodiments, the disclosed sustained self-sputtering techniques are used to incorporate lithium atoms into a workpiece having a partially or fully fabricated electrochromic device. FIGS. 4A and 4B are schematic cross-sections of an electrochromic device 201, showing a common structural motif for such devices. In this embodiment, the electrochromic device 201 includes a substrate 202, a conductive layer (CL) 204, an electrochromic layer (EC) 206, an optional ion conducting (electronically resistive) layer (IC) 208, a counter electrode layer (CE) 210, and another conductive layer (CL) 212. Elements 204, 206, 208, 210, and 212 are collectively referred to as an electrochromic stack 214. A voltage source 216, operable to apply an electric potential across electrochromic stack 212 effects the transition of the electrochromic device from, e.g., a bleached state (refer to FIG. 4A) to a colored state (refer to FIG. 4B).

The order of the layers may be reversed with respect to the substrate. That is, the layers may be in the following order: substrate 202, additional conductive layer 212, counter-electrode layer 210, ion conducting layer 208, electrochromic material layer 206, and conductive layer 204. Counter electrode layer 210 may include a material that is electrochromic or not. If both the electrochromic layer 206 and the counter electrode layer 210 employ electrochromic materials, one of them should be a cathodically coloring material and the other should be an anodically coloring material. For example, the electrochromic layer 206 may employ a cathodically coloring material and the counter electrode layer 210 may employ an anodically coloring material. This is the case when the electrochromic layer 206 is a tungsten oxide and the counter electrode layer is a nickel tungsten oxide.

The conductive layers 204, 212 commonly comprise transparent conductive materials, such as metal oxides, alloy oxides, and doped versions thereof, and are commonly referred to as "TCO" layers because they are made from transparent conducting oxides. In general, however, the transparent conductive layers 204, 212 can be made of any transparent, electronically conductive material that is compatible with the device stack. Some glass substrates are provided with a thin transparent conductive oxide layer such as fluorinated tin oxide, sometimes referred to as "TEC."

Electrochromic device 201 is meant for illustrative purposes, in order to understand the context of embodiments described herein. Methods and apparatus described herein that may be used to incorporate lithium atoms into a workpiece having a partially or fully electrochromic device, may be used regardless of the structural arrangement of the electrochromic device.

During normal tint transition, electrochromic device 201 reversibly cycles between a bleached state and a colored state. As depicted in FIG. 4A, in the bleached state, a potential is applied across the electrodes (transparent conductor layers 204 and 212) of electrochromic stack 214 to cause available ions (e.g., lithium ions) in the stack to reside primarily in the counter electrode 210. If electrochromic layer 206 contains a cathodically coloring material, the device 201 is in a bleached state. In certain electrochromic devices, when loaded with the available ions, counter electrode layer 210 can be thought of as an ion storage layer.

Referring to FIG. 4B, when the potential on the electrochromic stack 214 is reversed, the ions are transported across ion conducting layer 208 to electrochromic layer 206 and cause the material to enter the colored state. Again, this assumes that the optically reversible material in the electrochromic device 201 is a cathodically coloring electrochromic material. In certain embodiments, the depletion of ions from the counter electrode material causes it to color also as depicted. In other words, the counter electrode material is an anodically coloring electrochromic material. Thus, layers 206 and 210 combine to synergistically reduce the amount of light transmitted through the stack 214. When a reverse voltage is applied to device 201, ions travel from electrochromic layer 206, through the ion conducting layer 208, and back into counter electrode layer 210. As a result, the device 201 bleaches.

Some pertinent examples of electrochromic devices are presented in the following US patent applications, each incorporated by reference in its entirety: U.S. patent application Ser. No. 12/645,111, filed Dec. 22, 2009; U.S. patent application Ser. No. 12/772,055, filed Apr. 30, 2010 (now U.S. Pat. No. 8,300,298); U.S. patent application Ser. No. 12/645,159, filed Dec. 22, 2009 (now U.S. Pat. No. 8,432, 603); U.S. patent application Ser. No. 12/814,279, filed Jun. 11, 2010; U.S. patent application Ser. No. 13/462,725, filed May 2, 2012; and U.S. patent application Ser. No. 13/763, 505, filed on Feb. 8, 2013. Each of these applications describes processes including steps of sputtering lithium in a partially fabricated electrochromic device.

Electrochromic devices such as those described in relation to FIGS. 4A and 4B are used in, for example, electrochromic windows. For example, substrate 202 may be architectural glass upon which the layers of the electrochromic devices are fabricated. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, e.g., as large as about 72 inches by 120 inches.

As larger and larger substrates are used in electrochromic windows, it is desirable to minimize defects in the electrochromic devices, because otherwise the performance and visual quality of the electrochromic windows will suffer. The embodiments described herein may mitigate defectivity in electrochromic windows.

In some embodiments, one or more electrochromic windows are integrated into an insulating glass unit (IGU). In forming an IGU, multiple panes are assembled into a single IGU, generally with the intention of maximizing the thermal insulating properties of a gas contained in the space between panes formed by the IGU while at the same time providing clear vision through the IGU. IGUs incorporating electrochromic windows are similar to conventional IGUs (without electrochromic windows) currently known in the art, except with the addition of electrical terminals for connecting the electrochromic window(s) to a voltage source.

D. Exemplary Methods of Sustained Self-Sputtering of Lithium

Generally, disclosed methods of sustained self-sputtering of lithium include igniting an initial plasma having a majority fraction of sputtering gas ions and allowing the plasma to interact with the lithium metal target and sputter lithium. These methods also generally include inducing a sustained self-sputtering process by applying one or more operating and design conditions required for sustained lithium self-sputtering plasma. To apply these operating conditions, system parameters may be adjusted. For example, the supply of sputtering gas (e.g., inert gas) may be slowly reduced to a trace level. In some cases, the power to the cathode may be increased while the supply of sputtering gas is reduced. Optionally, these methods may also include modifying the operating conditions to maintain the sustained self-sputtering reaction. These methods may also include adjusting the lithium flux with respect to the workpiece surface. These methods may be employed to implement sustained self-sputtering of lithium at a lithium deposition station. One or more of the components of the sustained self-sputtering apparatus of embodiments may be used in these methods.

Figure 5:
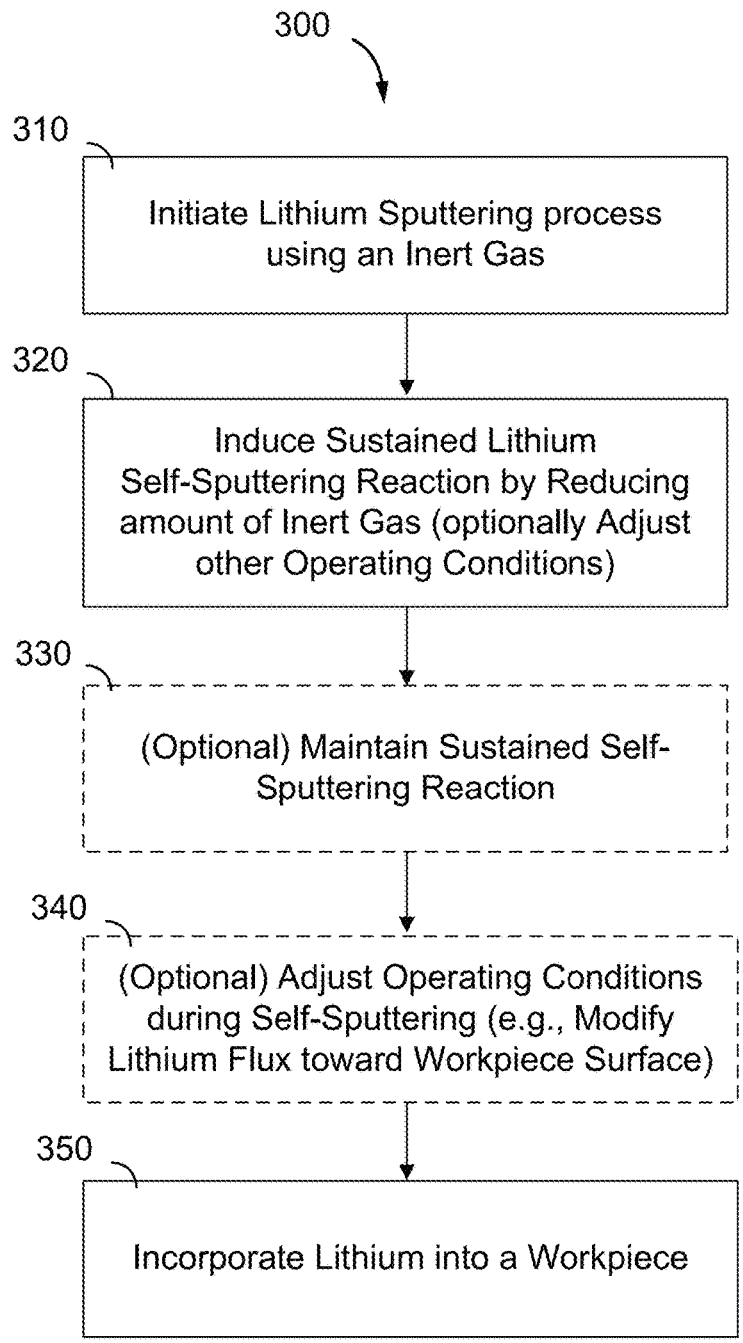
FIG. 5 is a flowchart depicting an example of a method of sustained self-sputtering of lithium, according to embodiments.

FIG. 5 is a flowchart depicting an example of a method of sustained self-sputtering of lithium, according to embodiments. This method may be used to incorporate lithium in a workpiece. Although inert or noble gas (e.g., argon, helium, etc.) is described with respect to FIG. 5 as being used in this method, any sputtering gas can be used.

At step 310, the lithium sputtering process is initiated. Initiating the sputtering process comprises igniting an initial plasma with an inert gas present and allowing the initial plasma to interact with the lithium metal target and sputter off lithium atoms. In some cases, it may be advantageous to use a gas with ions that have a mass close to that of the lithium ions being sputtered. For example, an inert gas with helium ions may be preferred to using an inert gas with argon ions. The initial plasma can be ignited with inert gas above the Paschen criteria with a lithium metal target.

Generally, for a plasma to ignite, an electron from the cathode region (e.g., target) is accelerated away from the cathode, which is at negative potential, towards the anode, which is at a more positive potential. Along the way, it has the opportunity to interact and collide with a neutral gas atom. When it does this, it converts the neutral gas atom into a positive gas ion and another electron. There are now two electrons and one ion. The electrons from this interaction continue to move towards and anode and continue to interact with neutral gas atoms, ionizing them along the way. This is referred to as the 'electron collision cascade' and drives the initial breakdown of gas at plasma ignition to strike a plasma. The plasma 'strike' is the electrons completing a path to ground and ions going to the cathode. The resulting ion has positive charge and is accelerated towards the cathode, which is at negative potential. This breakdown voltage for plasma strike is dependent on pressure in the chamber, distance between anode-cathode, the energy of the electrons, and gas molecules. These relationships can be defined by a Paschen curve.

Figure 6:
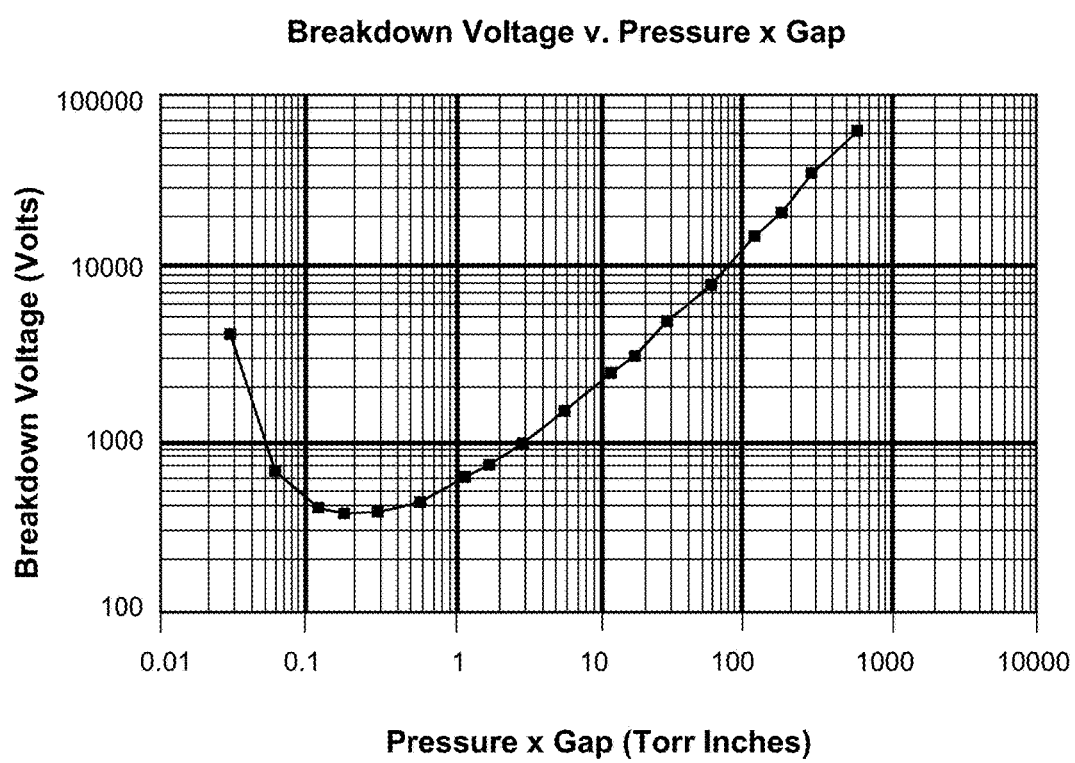
FIG. 6 is an example of a Paschen curve that can be used in embodiments.

A Paschen curve defines the relationship between the breakdown voltage and the pressure times the distance between the electrodes in the chamber where the plasma is to be initiated. A separate Paschen curve is determined for each combination of anode, cathode, and gas in the region between the anode and cathode. For example, there will be a single Paschen curve for argon between a lithium cathode and a stainless steel anode. There will be a different Paschen curve for helium between the lithium cathode and stainless steel anode. Still further, there will be a different Paschen curve for helium between the tungsten cathode and the stainless steel anode. An example of a Paschen curve is provided in FIG. 6. The breakdown voltages in a Paschen curve are dependent on the energy of the excited atom, the background gas species, and the distance to ground. The distance to ground can be influenced by the ground material or the conductivity/resistivity of the grounded surface.

Although the method described in reference to the flowchart in FIG. 3 comprises igniting a lithium plasma in the presence of a sputtering gas, a lithium plasma may be ignited in the absence of a sputtering gas in other embodiments. In order to initiate the lithium plasma without the inert gas would generally require substantially higher voltages than those required in igniting a lithium plasma in the presence of a sputtering gas.

Referring back to the flowchart in FIG. 3, the sputtering process initiated at step 310 is then converted to a sustained self-sputtering process at step 320. At step 320, a sustained self-sputtering reaction is induced by reducing the amount (e.g., by reducing pressure) of inert gas supplied to the sputter chamber to a low level (and optionally by adjusting other operating and design conditions). In some cases, the supply of inert gas is reduced to such a low level (e.g., trace level) that there is barely appreciable gas flow to the lithium metal target. After reducing the inert gas to the low level, the inert gas ions responsible for dislodging lithium atoms from the target are at least substantially replaced with lithium ions in the space near the lithium metal lithium metal target. The supply of inert gas is reduced to such a low level that the fraction of sputtering performed with lithium ions is at least greater than that performed with inert gas ions. The supply may be reduced by adjusting the flow rate or pressure at the inlet for the inert gas to the sputtering chamber. The supply of inert gas is slowly reduced. In one example, the supply of inert gas may be reduced at a rate within a predefined range. The supply of the carrier inert gas is reduced to a certain low level that will maintain a small mean-free path between ions and maintain and prevent the plasma from extinguishing. In one example, the inlet flow rate or pressure may be reduced to a trace level within a predefined range.

Optionally, at step 320, other operating conditions may be adjusted before, during and/or after the inert gas supply is reduced. For example, the mean free path may be maintained below a certain required level. The mean free path can be adjusted by modifying the background chamber pressure and by providing a deposition chamber having a certain distance from the lithium metal target to the potentially interacting sources, e.g., walls of the deposition chamber. As another example, the system may be adjusted to have a self-sputter yield of greater than 1. Other examples of operating conditions that may be adjusted as required for sustained self-sputtering of lithium include localized confinement of an ion source, and population of electrons (secondary electrons) from the sputter event to sustain further ionization. Confinement can be accomplished by providing magnetic fields, electric fields, and/or low gas pressure. As ions impinge on the target surface, some of the ejected target atoms must be ionized by the electrons in the plasma to continue the repeating self-sustaining sputtering process. For this reason, there needs to be a supply of electrons, which are secondary electrons from the lithium metal target that are ejected during the sputter event or from atoms in the plasma being ionized and losing an electron. This supply of electrons may be negligible in most cases. In some cases, the supply of electrons may be more significant when using high density plasmas or materials with high secondary electron coefficients. In one embodiment, an external source of electrons can be provided. For example, electrons can be provided by running a current through a wire filament. Then, the atom to be sputtered must be easily sputtered. A magnetic field helps contain the plasma in front of the lithium metal target and minimizes electron loss to surrounding surfaces, to help sustain the plasma. Various system parameters may be modified to adjust the operating conditions required for sustained self-sputtering of lithium. For example, pressure of the inert gas, the current and voltage applied to the cathode (e.g., target) and the anode, temperatures at different parts of the sputter chamber (e.g., lithium metal target), material composition of the lithium metal target, target diameter, pressure in lithium sputtering chamber, separation distance between the cathode and anode, distance between the workpiece and each of the anode and cathode, power (in watts) and frequency or frequencies used to sustain the plasma, etc.

In one aspect, the reduction of the supply of the inert gas to the deposition station at step 320 may be accompanied by other process changes to maintain the sustained self-sputtering reaction. For example, the power or voltage between the cathode and anode may be increased to at or above a minimum value while the supply of sputtering gas is being reduced. The minimum power or voltage required to maintain a sustained self-sputtering reaction is typically greater than the minimum power voltage required to sustain a non-self-sputtering reaction. In certain cases, the power to the cathode in a sustained self-sputtering reaction can be limited by the melting point of the lithium metal target, cooling efficiency of the cathode assembly, electrical isolation feedthrough design of the cathode, transmission line capability from the power supply to the cathode, and/or the limits of the power supply.

At step 330, the method optionally comprises adjusting the system parameters to ensure that the sustained self-sputtering reaction is maintained. For example, the power or voltage to the cathode/anode may be maintained above minimum values (e.g., minimum power and minimum voltage). As explained above, the minimum power or voltage required to sustain a self-sputtering reaction is likely greater than the minimum power voltage required to sustain a non-self-sputtering reaction.

At step 340, the method optionally comprises adjusting operating conditions during self-sputtering, for example, to improve performance. For example, the lithium flux may be adjusted. Generally, the flux of lithium to the workpiece in a self-sputtering reaction is lower than in a non-self-sputtering reaction. For this reason, it may be desirable in a self-sputtering reaction to adjust the lithium flux so that adequate amounts of lithium are incorporated in the workpiece. This may be accomplished by (1) adding lithium cathodes in the lithium sputtering station, (2) slowing the rate of transfer of the workpiece through the lithium sputtering station, (3) moving the lithium metal target closer to the workpiece or the workpiece closer to the lithium metal target, (4) and/or moving the cathodes closer to the workpiece or the workpiece closer to the cathodes. In one case, the system may comprise a feedback mechanism (e.g., sensor) that monitors (e.g., periodically measures) directly or indirectly the flux of lithium at the surface. The system parameters may be adjusted during the process according to the flux measurements from the feedback mechanism. Alternatively, there may be empirical data that can be used to adjust the system parameters to control the flux.

At step 350, the method comprises incorporating lithium atoms into the workpiece. Although the lithium atoms incorporated into the workpiece may include lithium ions and lithium neutral atoms, a substantial fraction of the lithium atoms incorporated are lithium ions in certain disclosed embodiments. In one embodiment, the workpiece may include a partially fabricated electrochromic device comprising one or more layers of material disposed on a substantially transparent substrate. The one or more layers may include a layer of anodically coloring electrochromic material such as NiWO and/or a transparent conductive layer.

E. Integrated Deposition System with Sustained Lithium Self-Sputtering Station(s)

In certain embodiments, sustained lithium self-sputtering operations and/or other fabrication operations are performed under vacuum and/or other controlled environmental conditions in an integrated deposition system. For example, a deposition integrated system may pass a substrate through one or more interconnected chambers or stations, each associated with a particular process operation and each integrated with a vacuum system or other pressure control system. In certain embodiments, one or more of these chambers or stations of an integrated system may be a sustained lithium self-sputtering apparatus that can perform sustained lithium self-sputtering on a substrate. In some cases, the integrated system may include a substrate holder and transport mechanism operable to hold the substrate, such as an architectural glass substrate, in a vertical or horizontal orientation while passing through one or more deposition stations. In some cases, the integrated deposition system may include one or more load locks for passing the substrate between an external environment and the integrated deposition system. In some cases, one or more of the stations are provided for particle removal. Such stations may optionally be included within the controlled environment of the sputtering stations. In some cases, the integrated system may be modular.

In certain embodiments, one or more of the stations/chambers of an integrated system are for depositing one or more individual layers making up an electrochromic device. In some of these cases, the integrated system includes one or more sustained lithium self-sputtering stations/chambers for depositing lithium on any one or more layers of an electrochromic device being fabricated. For example, the integrated system may include deposition stations for depositing one or more of an electrochromic layer, an ion conducting layer, and a counter electrode layer and one or more deposition stations for depositing lithium on one or more of these layers. Further examples of apparatus for fabricating electrochromic devices are described in the following U.S. Patent Applications, each hereby incorporated by reference in its entirety: Ser. Nos. 12/645,111, 12/645,159 (now U.S. Pat. No. 8,432,603), Ser. Nos. 13/462,725, and 12/814,279. In some cases, the layers of the electrochromic device are deposited on a substantially transparent substrate (e.g., glass substrate) to form a pane or lite of an electrochromic window.

Many types of sustained lithium self-sputtering apparatus may be employed to deposit lithium in accordance with the embodiments disclosed herein. Frequently one or more controllers are employed in the apparatus to control the process. Those of ordinary skill in the art will appreciate that processes disclosed herein may employ various processes involving data stored in or transferred through one or more computer systems and/or controllers. Certain embodiments relate to the apparatus, including associated computers and microcontrollers, for performing these operations. A control apparatus may be specially constructed for the required purposes, or it may be a general-purpose computer selectively activated or reconfigured by a computer program and/or data structure stored in the computer. The processes presented herein are not inherently related to any particular computer or other apparatus. In various embodiments, a controller executes system control software including sets of instructions for controlling the timing and sequence of the processing steps, processing conditions as described herein, and the like.

In certain embodiments, a controller contains or executes instructions for directing a substrate through a sustained lithium self-sputtering station/chamber and other stations/chambers in an integrated deposition system. The controller instructions may include instructions that specify, inter alia, the rate and direction of substrate transfer, the conditions at any station (e.g., pressure, temperature, sputtering power, and gas flow rates), and the pre- and post-treatment of the substrate. As an example, the controller instructions may include specific instructions for polishing and otherwise pretreating the substrate prior to deposition. The controller instructions may also include specific instructions for substrate post-treatments such as thermal or chemical conditioning. The controller instructions may specify the timing and conditions under which the particle removal device operates. Other computer programs, scripts, or routines stored on memory devices associated with the controller may be employed in some embodiments.

Figure 7A:
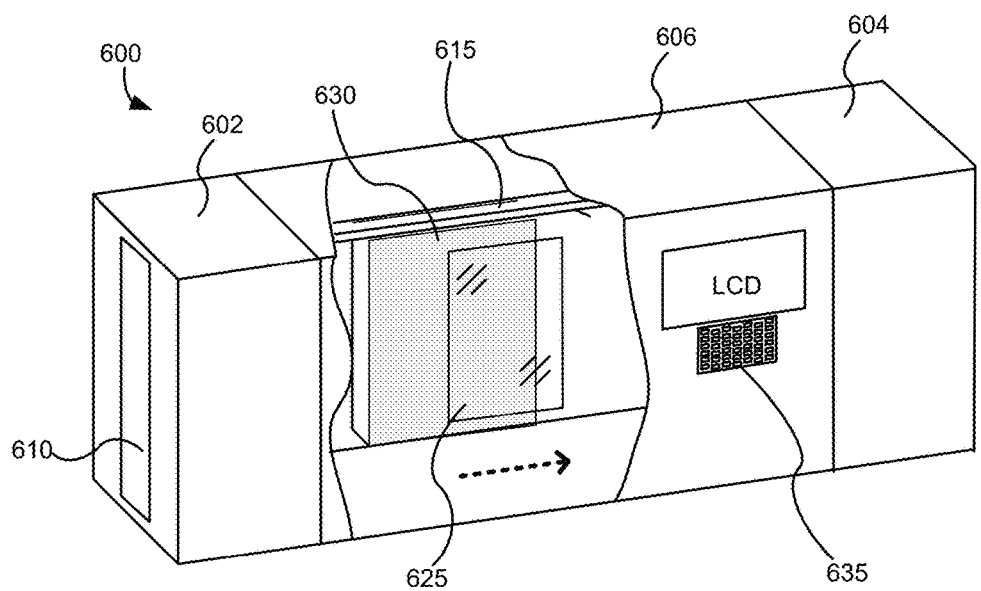
FIGS. 7A and 7B are illustrations of an integrated system with interconnected chambers or stations for performing sustained lithium self-sputtering and other fabrication operations to substrates in vertical and horizontal configurations, respectively, according to embodiments.
Figure 7B:
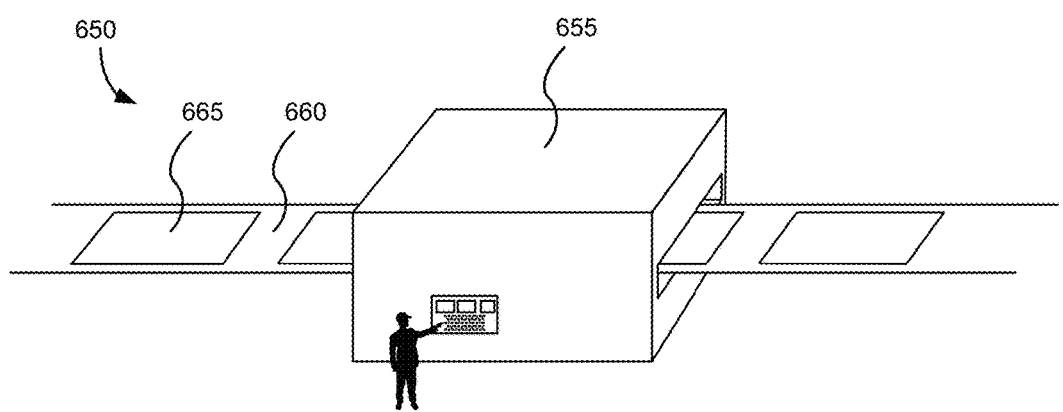

FIGS. 7A and 7B are illustrations of an integrated system with a series of interconnected chambers or stations for performing sustained lithium self-sputtering and optionally other fabrication operations on substrates in vertical and horizontal configurations, respectively, according to embodiments.

FIG. 7A depicts a simplified representation of the integrated system 600 in a perspective view and with more detail including a cutaway view of the interior showing a sustained lithium self-sputtering station having a lithium metal target 630. In FIG. 7A, lithium metal target 630 is a planar shape.

In the illustrated example, integrated system 600 is modular, where entry load lock 602 and exit load lock 604 are connected to deposition module 606 including one or more deposition stations. The entry loadlock 602 has an entry port, 610, for loading, for example, architectural glass substrate 625. Exit load lock 604 has a corresponding exit port (not shown). Substrate 625 is typically supported by a substrate holder, for example, a pallet which travels along a track, 615. The pallet could be supported by track 615 via hanging or supported atop a track located near the bottom of integrated apparatus 600 or a track, for example mid-way between top and bottom of integrated apparatus 600.

In this illustration, substrate 625 can translate (as indicated by the arrow) in a single direction through the integrated system 600 past lithium metal target 630 as lithium is sputtered on the surface of substrate 625. In another embodiment, substrate 625 may be able to translate in the opposite direction through the system 600. In yet another embodiment, substrate 625 may be able to translate in both directions, for example, forward and backward in front of lithium metal target 630 making multiple passes in order to achieve a desired lithiation.

In FIG. 7A, substrate 625 are in a substantially vertical orientation. Lithium metal target 630, in this case, is a planar target oriented substantially parallel to and in front of the substantially planar substrate surface where deposition is to take place (for convenience, other sputter means are not depicted here). During deposition, substrate 625 can translate past lithium metal target 630 and/or lithium metal target 630 can move in front of substrate 625.

Lithium metal target 630 need not be planar, it can be cylindrical or any shape necessary for deposition with the desired properties. Also, there may be more than one target in each deposition station and/or targets may move from station to station depending on the desired process. In addition, the movement of lithium metal target 630 may not limited to translation along the path of substrate 625. Lithium metal target 630 may rotate along an axis through its length, translate along the path of the substrate (forward and/or backward), translate along a path perpendicular to the path of the substrate, move in a circular path in a plane parallel to substrate 625, etc.

The various stations of an integrated deposition system of the invention may be modular, but once connected, form a continuous system where a controlled ambient environment is established and maintained in order to process substrates at the various stations within the system.

Integrated deposition system 600 also has various vacuum pumps, gas inlets, pressure sensors and the like that establish and maintain a controlled ambient environment within the system. These components are not shown, but rather would be appreciated by one of ordinary skill in the art. The operation of system 600 is controlled by, for example, a computer system or one or more controllers. The system 600 may also include a user interface for the computer system or controller(s). In FIG. 7A, system 600 includes a user interface for such controller(s) in the form of an LCD and keyboard 635.

FIG. 7B illustrates a variation of the apparatus shown in FIG. 7A. While the apparatus in FIG. 7A provides the substrate oriented vertically, the system of FIG. 6B provides a substrate 665 in a horizontal orientation. There are certain advantages to processing large format glass, such as architectural glass (at least about 20"×20") in a horizontal format. It can be difficult to support vertically oriented substrates in a fixed position during deposition. Horizontal substrates, however, can be fully supported underneath and held in fixed position by gravity. However, horizontal processing suffers from particle accumulation on the substrate, which provides a large surface for falling particles. However, with the integration of a particle removal station or device in the apparatus, horizontal processing becomes feasible.

FIG. 7B shows an integrated system 650 configured to process substrates 665 in a horizontal orientation. The integrated system 650 includes a deposition module that may contain one or more deposition stations for performing for sustained lithium self-sputtering and optionally other fabrication operations. The integrated system 650 includes a sustained lithium self-sputtering station (not shown) with a planar lithium metal target oriented substantially parallel to and in front of the substantially planar substrate surface where deposition is to take place. A horizontally-oriented track or conveyor 660 supports substrates 665 as they pass through the deposition module 655.

The deposition module 655 may optionally include a particle removal station housing a particle removal device for removing particles. In other embodiments, the particle removal device is located outside deposition module 655. In such cases, the apparatus may include two separate modules separated by a particle removal station. A layer or layers may be deposited in a first module, and then particle removal is performed after the substrate leaves the first module. After particle removal is completed, the substrate enters the second module, where the remaining layers are deposited. Some or all stations employed depositing materials are sputter deposition stations.

System 600 and system 650 include at least one station or chamber for performing sustained lithium self-sputtering in their respective deposition modules. Each of the sustained lithium self-sputtering stations or chambers includes at least one lithium metal target. The lithium metal target may be configured to function as a cathode, which has a negative charge applied. One or more of the other components of the station or chamber functions as an anode, which may have a positive charge applied. For example, the substrate holder, deposition station/chamber walls, and/or other components of the chamber may function as an anode. A voltage source may be used to apply the positive charge and negative charge.

Modifications, additions, or omissions may be made to any of the above-described methods without departing from the scope of the disclosure. Any of the methods described above may include more, fewer, or other steps without departing from the scope of the disclosure. Additionally, the steps of the described methods may be performed in any suitable order without departing from the scope of the disclosure.

Also, modifications, additions, or omissions may be made to the above-described systems, devices, or components thereof without departing from the scope of the disclosure. The components of the systems and devices may be integrated or separated according to particular needs. Moreover, the operations of the devices and systems can be performed by more, fewer, or other components. Additionally, operations of the systems and devices may be performed using any suitable logic comprising software, hardware, other logic, or any suitable combination of the preceding.

It should be understood that the present invention as described above can be implemented in the form of control logic using computer software in a modular or integrated manner. Based on the disclosure and teachings provided herein, a person of ordinary skill in the art will know and appreciate other ways and/or methods to implement the present invention using hardware and a combination of hardware and software.

Any of the software components or functions described in this application, may be implemented as software code to be executed by a processor using any suitable computer language such as, for example, Java, C++ or Perl using, for example, conventional or object-oriented techniques. The software code may be stored as a series of instructions, or commands on a computer readable medium, such as a random access memory (RAM), a read only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

Although the foregoing disclosed embodiments have been described in some detail to facilitate understanding, the described embodiments are to be considered illustrative and not limiting. It will be apparent to one of ordinary skill in the art that certain changes and modifications can be practiced within the scope of the appended claims.

One or more features from any embodiment may be combined with one or more features of any other embodiment without departing from the scope of the disclosure. Further, modifications, additions, or omissions may be made to any embodiment without departing from the scope of the disclosure. The components of any embodiment may be integrated or separated according to particular needs without departing from the scope of the disclosure.

What is claimed is:

1. A method of sustained self-sputtering of lithium in a sputtering station having a lithium metal target in a chamber, the method comprising:
   flowing an inert gas to the chamber;
   initiating a lithium sputtering reaction in the sputtering station by igniting an initial plasma comprising a majority fraction of inert gas ions; and
   inducing a sustained lithium self-sputtering reaction by reducing the flow of the inert gas to the sputtering station under conditions that provide a sustained self-sputtering lithium plasma comprising a majority fraction of lithium ions having a mean free path of between 6.1 cm and 61 cm, wherein the conditions include applying a voltage between an anode and the lithium metal target that is a cathode that is between 200 V and 500 V.

2. The method of claim 1, further comprising incorporating lithium from the lithium metal target into a workpiece while the workpiece is in the sputtering station, wherein the workpiece comprises a partially fabricated electrochromic device.

3. The method of claim 2, wherein the lithium is incorporated into one or more layers of the partially fabricated electrochromic device.

4. The method of claim 3, wherein one of the one or more layers of the partially fabricated electrochromic device is an anodically coloring electrochromic material layer comprising one of nickel, tungsten, and oxygen.

5. The method of claim 1, wherein the conditions that provide the sustained self-sputtering lithium plasma include one or more of maintaining a mean free path of lithium ions below a predefined level and maintaining a sputter yield above 1.0.

6. The method of claim 1, further comprising maintaining the sustained self-sputtering lithium plasma by adjusting process parameters.

7. The method of claim 6, wherein adjusting process parameters comprises one or more of:
   maintaining power to a cathode of the sputtering station above a pre-defined level;
   maintaining absolute pressure in the sputtering station between 0.1 and 1.0 mT; and
   maintaining a mean free path of lithium ions to below a pre-defined level.

8. The method of claim 1, further comprising adjusting lithium flux to within a predefined range based on measurements from a sensor.

9. The method of claim 8, wherein the lithium flux is adjusted by moving a workpiece relative to the lithium metal target.

10. A sustained lithium self-sputtering apparatus comprising:
    a sputtering station comprising:
       a chamber;
       an anode in the chamber;
       a lithium metal target in the chamber, wherein the lithium metal target is a cathode;
       a voltage source electrically connected to the anode and to the cathode; and
       an inlet that regulates flow of an inert gas to the chamber during operation; and
    a controller containing program instructions for:
       controlling conditions in the sputtering station to induce and maintain a sustained self-sputtering lithium plasma in which lithium ions have a mean free path of between 6.1 cm and 61 cm,
       controlling the inlet to regulate the flow of inert gas to the chamber during operation, including flowing the inert gas to the chamber and reducing the flow of the inert gas after the sustained self-sputtering lithium plasma is induced without extinguishing the sustained self-sputtering lithium plasma, and
       controlling the voltage source to coordinate delivery of a potential between the anode and the cathode that is between 200 V and 500 V.

11. The sustained lithium self-sputtering apparatus of claim 10, wherein the anode is a part of a wall of the chamber.

12. The sustained lithium self-sputtering apparatus of claim 10, wherein the lithium metal target is made of at least 75% lithium metal.

13. The sustained lithium self-sputtering apparatus of claim 10, wherein lithium sputtered from the lithium metal target in the presence of the sustained self-sputtering lithium plasma is incorporated into a workpiece while the workpiece is present in the chamber of the sputtering station.

14. The sustained lithium self-sputtering apparatus of claim 13, wherein the workpiece is located within a pre-defined distance from the cathode, and wherein the workpiece comprises a partially fabricated electrochromic device.

15. The sustained lithium self-sputtering apparatus of claim 14, wherein one of the one or more layers of the partially fabricated electrochromic device is an anodically coloring electrochromic material layer comprising one of nickel, tungsten, and oxygen.

16. The sustained lithium self-sputtering apparatus of claim 10, wherein the controller contains further program instructions for maintaining absolute pressure in the sputtering station between 0.1 and 1.0 mT.

17. The sustained lithium self-sputtering apparatus of claim 10, wherein the controller contains further program instructions for maintaining a sputter yield of greater than one, wherein the sputter yield is the number of lithium atoms ejected from the lithium metal target per incident lithium atom.

18. The sustained lithium self-sputtering apparatus of claim 10, wherein the controller contains further program instructions for communicating signals to the voltage source to increase power to the cathode to above a predefined level.

19. The sustained lithium self-sputtering apparatus of claim 10, further comprising a sensor in communication with the controller, wherein the controller contains further program instructions for adjusting lithium flux to the workpiece based on measurements from the sensor.

20. The sustained lithium self-sputtering apparatus of claim 19, further comprising a mechanism for moving the workpiece relative to the lithium metal target, the mechanism in communication with the controller, wherein the lithium flux is adjusted by sending signals to the mechanism to move the workpiece relative to the lithium metal target.

21. The sustained lithium self-sputtering apparatus of claim 10, wherein the distance between the anode and the cathode is greater than 100 cm.

22. The sustained lithium self-sputtering apparatus of claim 10, wherein the distance between the anode and the cathode is between 60 cm and 100 cm.

23. The sustained lithium self-sputtering apparatus of claim 10, wherein the controller contains further program instructions for controlling conditions in the sputtering station such that the sustained self-sputtering lithium plasma includes one or both a mean free path of lithium ions below a predefined level and a sputter yield above 1.0, wherein the sputter yield is the number of lithium atoms ejected from the lithium metal target per incident lithium ion.

24. The sustained lithium self-sputtering apparatus of claim 10, wherein the inert gas is helium.

25. The sustained lithium self-sputtering apparatus of claim 10, wherein the distance between the anode and the cathode is greater than the mean free path of the sustained self-sputtering lithium plasma.

* * * * *